US008527847B2

(12) United States Patent
Sasaki

(10) Patent No.: US 8,527,847 B2
(45) Date of Patent: Sep. 3, 2013

(54) CHANNEL SWITCHING SIGNAL GENERATING CIRCUIT AND CHANNEL SWITCHING SIGNAL GENERATING METHOD

(75) Inventor: Eisaku Sasaki, Minato-ku (JP)

(73) Assignee: NEC Corporation, Tokyo (JP)

( * ) Notice: Subject to any disclaimer, the term of this patent is extended or adjusted under 35 U.S.C. 154(b) by 1179 days.

(21) Appl. No.: 12/441,243

(22) PCT Filed: Sep. 21, 2007

(86) PCT No.: PCT/JP2007/068384
§ 371 (c)(1),
(2), (4) Date: Mar. 13, 2009

(87) PCT Pub. No.: WO2008/035763
PCT Pub. Date: Mar. 27, 2008

(65) Prior Publication Data
US 2009/0292967 A1 Nov. 26, 2009

(30) Foreign Application Priority Data

Sep. 22, 2006 (JP) ................................. 2006-257482

(51) Int. Cl.
H03M 13/00 (2006.01)
(52) U.S. Cl.
USPC .......................................... 714/780; 714/794
(58) Field of Classification Search
USPC ................................................. 714/780, 794
See application file for complete search history.

(56) References Cited

U.S. PATENT DOCUMENTS

| 6,263,467 | B1 * | 7/2001 | Hladik et al. | 714/755 |
|---|---|---|---|---|
| 7,162,683 | B2 * | 1/2007 | Bune | 714/794 |
| 7,237,181 | B2 * | 6/2007 | Richardson | 714/780 |
| 7,246,295 | B2 * | 7/2007 | Xu | 714/755 |
| 8,015,468 | B2 * | 9/2011 | Krouk et al. | 714/752 |
| 2002/0147948 | A1 * | 10/2002 | Bune | 714/704 |
| 2002/0165004 | A1 * | 11/2002 | Chen et al. | 455/522 |
| 2004/0260995 | A1 * | 12/2004 | Allpress | 714/755 |
| 2005/0085255 | A1 * | 4/2005 | Andersson et al. | 455/522 |

FOREIGN PATENT DOCUMENTS

| CN | 1244073 A | 2/2000 |
|---|---|---|
| CN | 1625848 A | 6/2005 |
| JP | 07-202853 A | 8/1995 |
| JP | 08-004257 B2 | 1/1996 |

(Continued)

OTHER PUBLICATIONS

Office Action, Issued Dec. 21, 2011 by the State Intellectual Property Office of the People's Republic of China in counterpart Chinese Application No. 200780034827.2.

Primary Examiner — Joshua Lohn
(74) Attorney, Agent, or Firm — Sughrue Mion, PLLC

(57) ABSTRACT

An error correction decoder (101) counts the number of times of iterative decoding executed in the process of a predetermined error correcting operation, and outputs the iterative decoding count to an averaging circuit (102). The averaging circuit (102) calculates the average value of the iterative decoding counts input from the error correction decoder (101), and outputs the calculated average value of the iterative decoding counts to a comparator (103). The comparator (103) determines whether the iterative decoding count average value is larger than a predetermined threshold value. When determining that the average value is larger than the predetermined threshold value, the comparator (103) determines that a channel switching condition is met, and outputs a channel switching signal to a channel switching circuit (405). This makes it possible to output the channel switching signal under appropriate conditions without increasing the number of circuits in a wireless communication system using a highly coding gain code to be iteratively decoded.

11 Claims, 6 Drawing Sheets

(56) References Cited

FOREIGN PATENT DOCUMENTS

| | | |
|---|---|---|
| JP | 2004-015259 A | 1/2004 |
| JP | 2005-503044 A | 1/2005 |
| JP | 2006-211017 A | 8/2006 |
| WO | 2005/041439 A2 | 5/2005 |

* cited by examiner

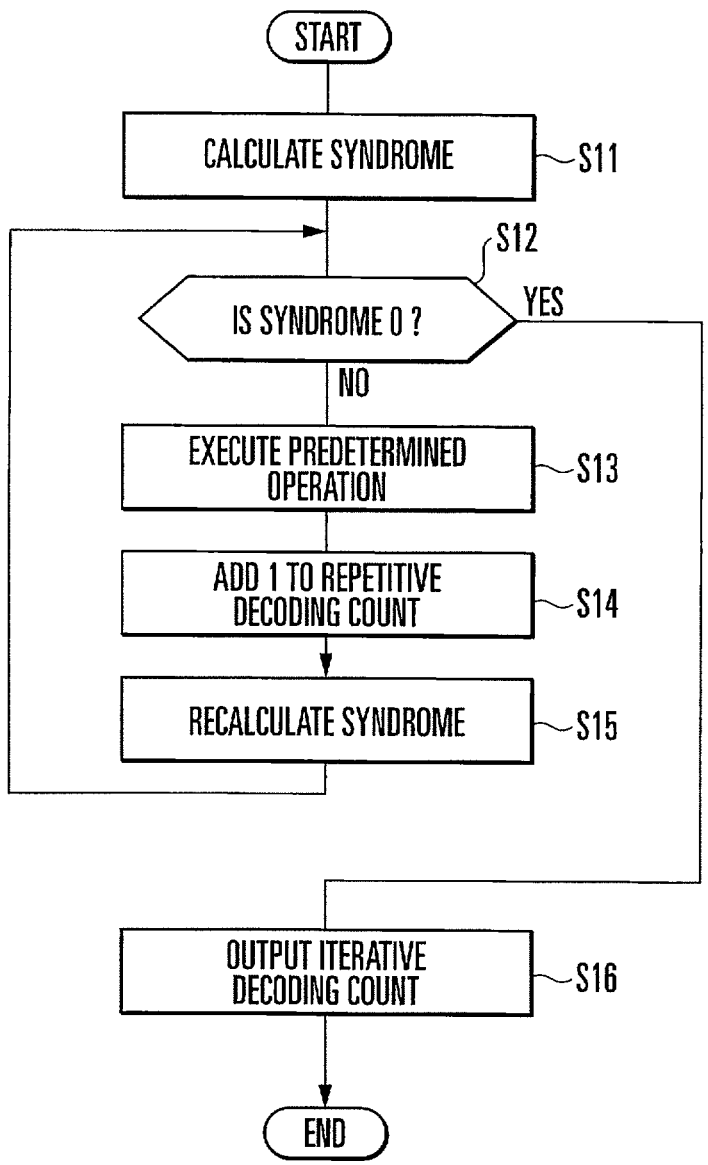
F I G. 3

CHANNEL SWITCHING SIGNAL GENERATING CIRCUIT AND CHANNEL SWITCHING SIGNAL GENERATING METHOD

TECHNICAL FIELD

This application is based upon and claims the benefit of priority from the prior Japanese Patent Application No. 2006-257482, filed Sep. 22, 2006, the entire contents of which are incorporated herein by reference.

The present invention relates to a channel switching signal generating circuit and channel switching signal generating method of outputting a channel switching signal of a wireless communication system using an error correction code by which a highly coding gain is obtained by iterative decoding and, more particularly, to a channel switching signal generating circuit and channel switching signal generating method of estimating the error rate of a transmission channel and outputting a switch signal, on the basis of information of an iterative decoding count required before the number of error bits output from an error correction decoder becomes 0.

BACKGROUND ART

The coding gain (a C/N difference before and after error correction that achieves a necessary bit error rate (BER)) of the forward error correction (FEC) method applied to wireless communication systems is desirably high. Therefore, wireless communication systems are beginning to adopt highly coding gain codes (e.g., a turbo (convolutional) code, turbo product code (TPC), and LDPC code) that have been extensively studied in recent years. Since these highly coding gain codes are adopted, systems can be used at a C/N lower than that when using the RS (Reed-Solomon) code as a representative code adopted in the conventional systems. Another feature of these highly coding gain codes is that the code length is longer than those of codes such as the RS code in order to increase the coding gain.

On the other hand, the reception level of a wireless communication system fluctuates in accordance with the status of a transmission channel. In many wireless communication systems, therefore, a protection channel is formed for an important channel, and the regular channel is switched to the protection channel by using a channel switching apparatus if the condition of the regular channel deteriorates. For example, Japanese Patent Publication No. 8-4257 (reference 1) describes a channel switching apparatus capable of well following the quality deterioration speed of a propagation channel by monitoring the channel quality before error correction even in a system having an error correcting function.

An error correction code used in the conventional wireless communication systems is generally a linear block code (e.g., the RS code or BCH code) to be decoded on the basis of the bounded distance decoding method using a hard-decision signal alone. When using these linear block codes, a decoder executes decoding only once for each code block. In addition, during the course of a decoding operation, the decoder outputs a syndrome signal indicating the presence/absence of errors in a transmitted block, and an error bit correction signal to be used when correcting error bits. The error rate information of the transmission channel can be obtained on the basis of the occurrence probability (i.e., the number of times of occurrence within a predetermined time) of these signals (the syndrome signal and error bit correction signal). The regular channel and protection channel are switched on the basis of this error rate information.

Also, since the coding gain of the linear block code as described above is not so high, a state in which the BER after error correction is about $1 \times 10^{-6}$ can be detected on the basis of the syndrome signal or error bit correction signal.

Furthermore, in wireless communication systems, channel switching is performed when the channel quality matches a predetermined condition. Generally, channel switching is executed when the BER has exceeded a predetermined value (e.g., $1 \times 10^{-6}$). In this case, a system in operation cannot directly measure the BER. In a system having an error correcting function, therefore, the syndrome signal or error bit correction signal as the error rate information output by an error correction decoder during the operating process is observed for a predetermined time, and the BER is estimated by the number of observed signals.

The syndrome signal takes a value 0 if there are no errors bit in a code block, and a value 1 if there is even one bit error.

Also, the conventional method such as the RS code detects the positions and bit patterns of errors from a decoding operation result corresponding to a hard-decision signal, and executes error correction by inverting a decoder input signal. In this case, the signal for bit inversion is an error bit correction signal. That is, when error correction is correctly executed, the error bit correction signal is a pulse signal corresponding to the number of bits of the errors.

Assume that when using the syndrome signal as the error rate information, the code length is n bits, and the BER before correction equivalent to the BER of the switching condition after correction is p. In this case, the occurrence probability of the syndrome signal can be obtained by calculating the probability of the occurrence of an error having one bit or more in the n bits from p. By detecting a state equal to this syndrome signal occurrence probability, a switch signal can be output when the BER of the switching condition is detected. Note that even when using the error bit correction signal as the information source (error rate information), a switch signal can be output by performing control in accordance with the same concept as above.

A channel switching signal generating circuit in the wireless communication system described in, e.g., reference 1 will be explained below with reference to the accompanying drawings. FIG. 11 is a block diagram showing an example of the arrangement of the channel switching signal generating circuit used in the wireless communication system. In this example shown in FIG. 11, the channel switching signal generating circuit includes a decoder 904, counter 905, and comparator 903.

Referring to FIG. 11, the counter 905 receives a syndrome signal or error bit correction signal ("an error correction control bit" in reference 1) output from the decoder 904. Also, the counter 905 counts the input signals (syndrome signals or error bit correction signals) within a set observation period. The counter 905 then outputs the input signal count result to the comparator 903. The comparator 903 compares a threshold value with the output (count result) from the counter 905, and outputs a switch signal.

DISCLOSURE OF INVENTION

Problems to be Solved by the Invention

If, however, the channel switching method shown in FIG. 11 is applied when using a highly coding gain code (e.g., the LDPC code) that undergoes iterative decoding (a decoding process is repetitively executed for one code block) by using a soft-decision signal, it is impossible to achieve switching at a BER of about $1 \times 10^{-6}$ that is appropriate when using the syndrome signal. Also, if this method is applied when using the error bit correction signal, it is necessary to add circuits unnecessary for the original decoding operation.

More specifically, the following problems arise if the channel switching signal generating circuit shown in FIG. 11 is directly applied to the LDPC code as a highly coding gain code.

The first problem is that even when the method is directly applied to a highly coding gain code, the syndrome signal cannot be used in the determination of a channel switching condition. When using a highly coding gain code such as the LDPC code, a highly coding gain raises the BER before correction as an object of observation. Also, since the code length is long, the probability of the occurrence of error bits in one code word is higher than that of a code having a short code length for the same BER. Accordingly, even when the BER is lower than the switching condition, the syndrome signal occurrence probability is almost 100%. This makes it impossible to determine the switching condition by using the syndrome signal, so the syndrome signal cannot be used as an information source for switching.

FIG. 12 is a graph showing the syndrome signal occurrence probability. Referring to FIG. 12, the abscissa indicates the BER before correction, and the ordinate indicates the syndrome signal occurrence probability. A curve 201 shows the characteristic when using the LDPC code as a highly coding gain code. A curve 202 shows the characteristic when using the RS code.

The second problem is that when using the error bit correction signal, a decoder requires an additional circuit in order to output the error bit correction signal. An RS-code decoder detects the bit positions of errors, and corrects the error bits by inverting bits in the detected positions. By contrast, an iterative decoding type decoder performs signal processing of updating a signal to a more certain signal by repeating decoding. To output error bit information, therefore, it is necessary to successively compare the MSB (Most Significant Bit) of the log likelihood ratio (LLR) as input information to the decoder and an uncorrected signal with an output signal as the decoding result.

When using the LDPC code, parallel processing of decoding is generally performed in order to increase the signal processing speed. This requires successive comparators for successively comparing the MSB of the log likelihood ratio with the output signal as the decoding result and counters for counting error bit correction signals as outputs from these successive comparators equal in number to the parallel circuits. These circuits are unnecessary for the original error correction decoding process, and must be added in order to exclusively output a switch signal. This increases the circuit scale.

It is, therefore, an object of the present invention to provide a channel switching signal generating circuit and channel switching signal generating method capable of outputting a channel switching signal under appropriate conditions without increasing the number of circuits in a wireless communication system using a highly coding gain code (e.g., the LDPC code) to be iteratively decoded.

Means for Solving the Problems

A channel switching signal generating circuit according to the present invention comprises iterative decoding count output means for outputting an iterative decoding count indicating the number of times of iterative execution of a predetermined error correcting operation, channel switching condition determining means for determining whether a channel switching condition is met, on the basis of the iterative decoding count output from the iterative decoding count output means, and switch signal output means for outputting a switch signal indicating channel switching, when the channel switching condition determining means determines that the channel switching condition is met.

A channel switching signal generating method according to the present invention comprises the steps of outputting an iterative decoding count indicating the number of times of iterative execution of a predetermined error correcting operation, determining whether a channel switching condition is met, on the basis of the iterative decoding count, and outputting a switch signal indicating channel switching, when it is determined that the channel switching condition is met.

Effect of the Invention

In the present invention, a switch signal is output by determining whether a channel switching condition is met, on the basis of the iterative decoding count of an error correcting operation. Accordingly, in a wireless communication system using a highly coding gain code to be iteratively decoded, a channel switching signal can be output under appropriate conditions without increasing the number of circuits.

BRIEF DESCRIPTION OF DRAWINGS

FIG. 3 is a flowchart showing an example of processing executed by an error correction decoder;

BEST MODE FOR CARRYING OUT THE INVENTION

First Exemplary Embodiment

Figure 1:
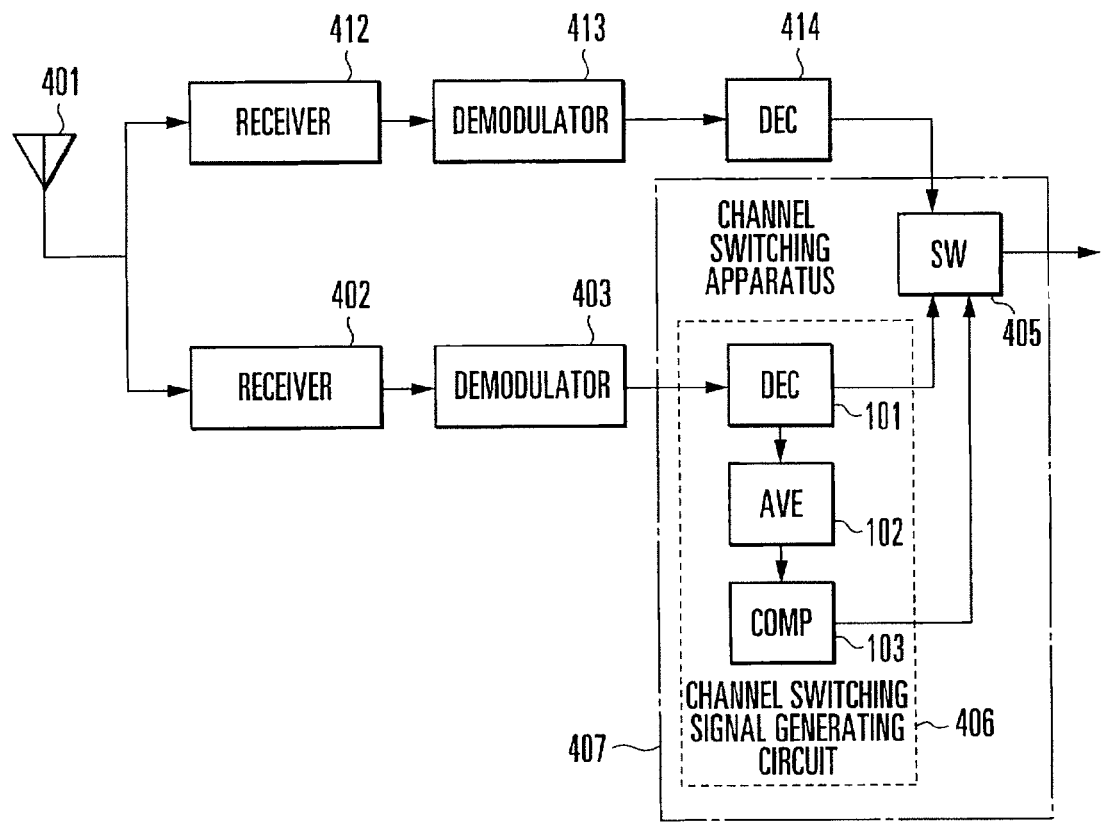
FIG. 1 is a block diagram showing an example of the arrangement of the receiving-side main parts of a microwave communication system using a channel switching signal generating circuit according to the present invention.

The first exemplary embodiment of the present invention will be explained below with reference to the accompanying drawings. FIG. 1 is a block diagram showing an example of the arrangement of the receiving-side major components of a microwave communication system using a channel switching signal generating circuit according to the present invention. This microwave wireless communication system uses a highly coding gain code (e.g., the LDPC code) to be iteratively decoded. As shown in FIG. 1, the microwave wireless communication system includes at least an antenna 401, receivers 402 and 412, demodulators 403 and 413, error correction decoders (DEC) 101 and 414, a channel switching circuit (SW) 405, an averaging circuit (AVE) 102, and a comparator (COMP) 103.

The receiver 402, demodulator 403, and error correction decoder 101 are devices for the regular channel, and the receiver 412, demodulator 413, and error correction decoder 414 are devices for a protection channel. The channel switching circuit 405 is a switch that switches the regular channel to the protection channel on the basis a channel switching signal. The error correction decoder 101, averaging circuit 102, and comparator 103 form a channel switching signal generating circuit 406 that outputs the channel switching signal to the channel switching circuit 405. A channel switching apparatus 407 is implemented by, e.g., a transmitting apparatus incorporating the channel switching signal generating circuit 406 and channel switching circuit 405.

Figure 2:
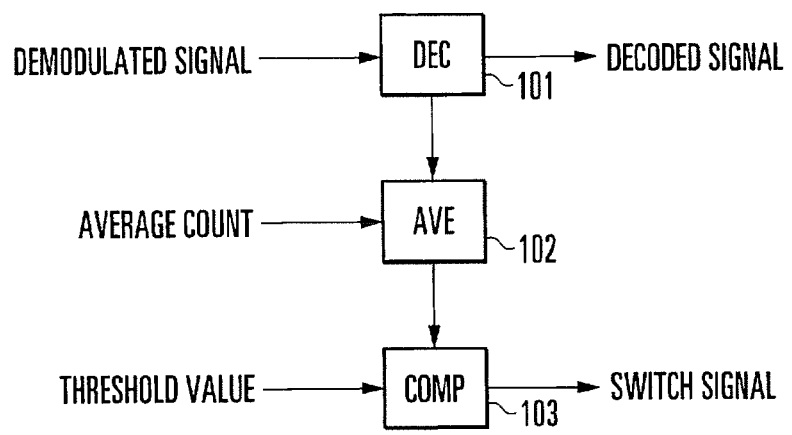
FIG. 2 is a block diagram showing an example of the arrangement of the channel switching signal generating circuit according to the present invention.

FIG. 2 is a block diagram showing an example of the arrangement of the channel switching signal generating circuit according to the present invention. As shown in FIG. 2, the channel switching signal generating circuit 406 includes the error correction decoder 101, averaging circuit 102, and comparator 103. Referring to FIG. 2, the error correction decoder 101 has a function of receiving a demodulation result (demodulated signal) as an output from the demodulator 403. The error correction decoder 101 also has a function of outputting a decoding result (decoded signal) by iteratively executing a predetermined error correcting operation. Furthermore, the error correction decoder 101 has a function of counting the number of times of iterative decoding executed during the process of the predetermined error correcting operation, and outputting the iterative decoding count to the averaging circuit 102. In this exemplary embodiment, the error correction decoder 101 successively measures the iterative decoding count and outputs it to the averaging circuit 102 whenever executing the processing of the predetermined error correcting operation.

The averaging circuit (average value calculator) 102 has a function of receiving the iterative decoding count from the error correction decoder 101. That is, the averaging circuit 102 successively receives the iterative decoding count whenever the error correction decoder 101 executes the processing of the predetermined error correcting operation. In this exemplary embodiment, a predetermined value indicating the number of times of inputting of the iterative decoding count is preset in the averaging circuit 102. The averaging circuit 102 has a function of calculating the average value of the iterative decoding counts equal to the number of times indicated by the preset value, whenever receiving the iterative decoding counts equal to the number of times indicated by the preset value. The averaging circuit 102 also has a function of outputting the calculated average value of the iterative decoding counts to the comparator 103.

A predetermined threshold value is preset in the comparator 103. The comparator 103 has a function of estimating the BER, when receiving the average value of the iterative decoding counts from the averaging circuit 102, by comparing the preset threshold value with the average value of the iterative decoding counts. More specifically, if the average value of the iterative decoding counts exceeds the threshold value, the comparator 103 determines that the channel switching condition is met, and outputs a switch signal for controlling channel switching to the channel switching circuit 405. Note that the channel switching circuit 405 is incorporated in, e.g., the channel switching apparatus incorporating the channel switching signal generating circuit 406.

The operation will now be explained. First, an outline of the operation of the error correction decoder 101 of the channel switching signal generating circuit 406 will be explained below. FIG. 3 is a flowchart showing an example of processing executed by the error correction decoder 101. As an input signal, the error correction decoder 101 receives information corresponding to the signal certainty called a log likelihood ratio (LLR). The LLR is a soft-decision signal represented by a plurality of bits. The MSB (Most Significant Bit) of this LLR is a hard-decision signal. On the basis of this MSB, the error correction decoder 101 first calculates a syndrome (step S11).

If the calculated syndrome is 0 (Y in step S12), then there are no bit errors, so the error correction decoder 101 immediately completes the decoding process. That is, the error correction decoder 101 completes the process in the first iterative decoding. In this case, the error correction decoder 101 terminates the process without ever executing a predetermined decoding process, and outputs an iterative decoding count 0 (step S16).

If the calculated syndrome is not 0 (N in step S12), then there are bit errors, so the error correction decoder 101 executes a predetermined decoding operation once (step S13). As a result of this decoding operation, the certainty of the signal rises, and the number of bit errors in the decoded data decreases. The error correction decoder 101 adds 1 to the iterative decoding count (step S14), and recalculates the syndrome by performing the syndrome calculating operation (step S15). Then, the process returns to step S12.

If the recalculated syndrome is 0 (Y in step S12), the error correction decoder 101 completes the decoding process, and outputs the current iterative decoding count (step S16).

If the recalculated syndrome is not 0 (N in step S12), the process advances to step S13. After that, the error correction decoder 101 iteratively executes the above procedure (the processes in steps S12 to S15) until the syndrome becomes 0. When the syndrome has become 0, the error correction decoder 101 outputs the current iterative decoding count (step S16), and terminates the process.

The higher the BER of a transmission channel, the larger the iterative decoding count required before the number of bit errors becomes 0. On the other hand, to hold the decoding delay time constant, an upper limit must be set for the iterative decoding count. When the BER is very high, therefore, bit errors remain and the syndrome does not become 0 in some cases even if the final decoding process determined as the upper limit is performed. If this is the case, this upper-limiting value is output as the iterative decoding count.

Also, even when the BER is constant as a result of long-time measurement, the iterative decoding count required before the number of bit errors becomes 0 varies because the number of local errors such as errors in a code block fluctuates from time to time. To increase the accuracy of the estimated value of the BER, therefore, the decoding counts need only be averaged. To implement this averaging process, it is only necessary to simply add decoding counts equal to the number of times to be averaged, and divide the sum of the decoding counts by the number of times of addition. When the number of times of addition is the power of two, a circuit for performing the division can be implemented by bit shift, so the averaging circuit 102 can be implemented by a small circuit scale. Note that no averaging process is necessary when outputting a switch signal by using "when the maximum value of the decoding counts has exceeded a threshold value" as the switching condition.

On the other hand, when the number of decoding counts to be averaged is increased, the accuracy of the BER estimated value rises, but the delay time before the calculation result of the BER estimated value is output prolongs. If channel switching is not complete within a short time, the channel quality deterioration may further advance to cause a hit. Accordingly, the set value of the number of times to be averaged must be balanced with the required accuracy of the BER estimated value.

Figure 4:
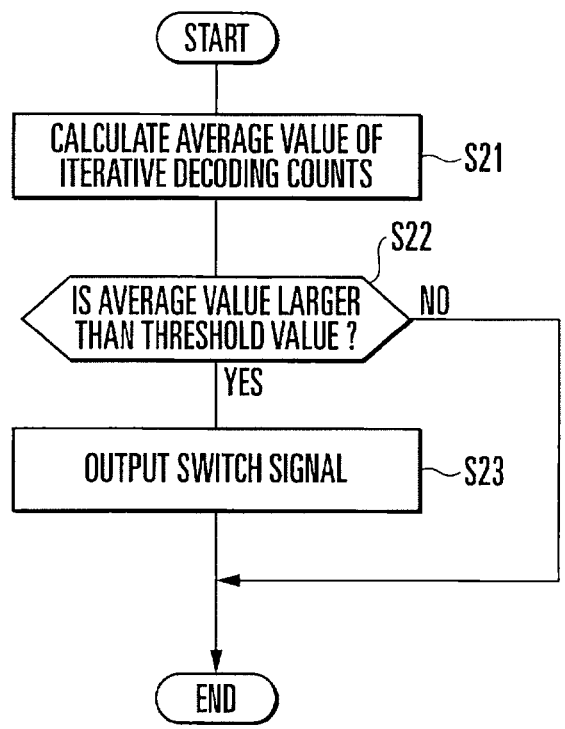
FIG. 4 is a flowchart showing an example of processing by which the channel switching signal generating circuit outputs a switch signal.

An operation by which the channel switching signal generating circuit 406 outputs a switch signal will be explained below. FIG. 4 is a flowchart showing an example of processing by which the channel switching signal generating circuit 406 outputs a switch signal. The averaging circuit 102 of the channel switching signal generating circuit 406 calculates the average value of the iterative decoding counts input from the error correction decoder 101 (step S21). That is, when receiving, e.g., iterative decoding counts equal to the number of times indicated by a preset value from the error correction decoder 101, the averaging circuit 102 calculates the average value of the iterative decoding counts equal to the number of times indicated by the set value. Then, the averaging circuit 102 outputs the calculated average value of the iterative decoding counts to the comparator 103.

The comparator 103 compares the decoding count average value as an output from the averaging circuit 102 with a predetermined threshold value. The comparator 103 determines whether the decoding count average value is larger than the predetermined threshold value (step S22). If the decoding count average value exceeds the predetermined threshold value, the comparator 103 determines that the channel switching condition is met, and outputs a switch signal to the channel switching circuit 405 (step S23).

On the basis of the switch signal input from the comparator 103, the channel switching circuit 405 controls switching from the regular channel to the protection channel. That is, the channel switching circuit 405 switches the output signal from a signal of a device of the regular channel to a signal of a device of the protection channel.

When the BER after correction is about $1 \times 10^{-6}$, bit errors are completely corrected by a decoding count equal to or smaller than the upper-limiting value in most code blocks, and bit errors cannot completely be corrected in a very few blocks. In this situation, therefore, the decoding count average value is smaller than the upper-limiting value corresponding to the BER before correction.

Figure 5:
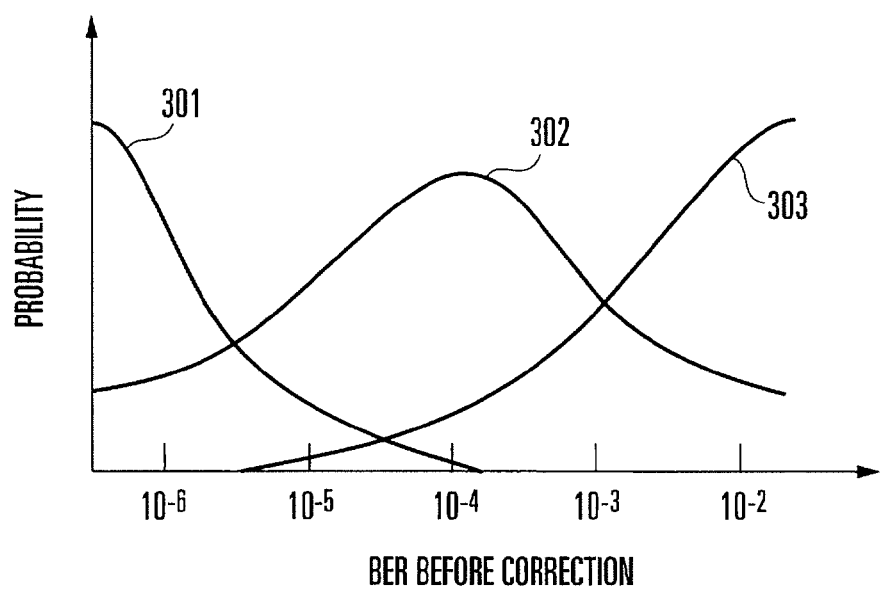
FIG. 5 is a graph showing the relationship between the iterative decoding count and the BER before correction.

FIG. 5 is a graph showing the relationship between the iterative decoding count and the BER before correction. Referring to FIG. 5, the abscissa indicates the BER before correction, and the ordinate indicates the occurrence probability of the iterative decoding count. Also, curves 301, 302, and 303 shown in FIG. 5 indicate the characteristics of the BER before correction when the iterative decoding counts are k, l, and m, respectively (k<l<m). As shown in FIG. 5, the probability of the decoding count decreasing is high when the BER is low, and the probability of the decoding count increasing rises as the BER increases.

In addition, since the decoding count average value is expressed by using a decimal, a switch signal activating condition (C/N threshold value) can be finely set.

The difference between the channel switching signal generating circuit 406 disclosed in this exemplary embodiment and the technique described in reference 1 will be explained below. In the technique described in reference 1, a switch signal is generated on the basis of "bit error rate information before error correction" of the decoder output. This "bit error rate information before error correction" is "an error correction control bit generated in a correcting mechanism" (see reference 1). When reference 1 was filed (1987), an error correction code applied to wireless communication systems was the BCH code or Lee code. Accordingly, it is obvious that the "error correction control bit" is a bit inverting signal for inverting a bit, and includes a syndrome signal if the meaning is interpreted in a broad sense. The bit inverting signal or syndrome signal is surely a signal generated when an error correcting operation is executed, and is information directly corresponding to object data of the error correcting operation.

By contrast, the iterative decoding count used in the present invention is "not generated by a correcting mechanism", has only an indirect relation to object data of the error correcting operation, and is not assumed at all in the technique described in reference 1.

In this exemplary embodiment as described above, the error rate information (e.g., the average value of the iterative decoding counts) of a transmission channel is obtained on the basis of the iterative decoding count indicating the number of times of repetition of a predetermined decoding process performed by the error correction decoder 101. Therefore, a slight error rate difference can be detected even at a very high BER before error correction. Consequently, even when using a highly coding gain code, a switch signal can be output at a BER matching the channel switching condition.

Also, in this exemplary embodiment, the error rate information is obtained once whenever one code block is decoded. This makes it possible to well shorten the time before a switch signal is output, and implement hitless switching.

Furthermore, in this exemplary embodiment, the averaging circuit 102 for averaging the iterative decoding counts can be implemented by an extremely small scale circuit. Accordingly, the circuit scale does not increase compared to those of the conventional methods.

In a wireless communication system using a highly coding gain code (e.g., the LDPC code) to be iteratively decoded, therefore, a channel switching signal can be output under appropriate conditions without increasing the number of circuits.

Figure 6:
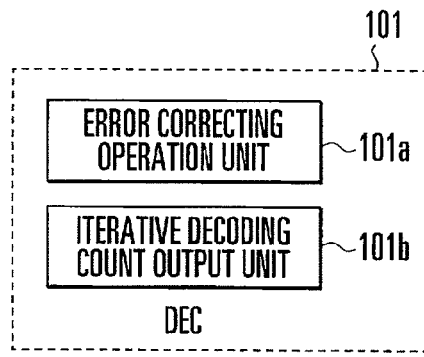
FIG. 6 is a view showing an example of the arrangement of the error correction decoder.

Note that the error correction decoder 101 of the channel switching signal generating circuit 406 shown in FIG. 2 may also include an error correcting operation unit 101*a* and iterative decoding cont output unit 101*b* as shown in FIG. 6. The error correcting operation unit 101*a* performs the processes in steps S11 to S15 shown in FIG. 3. The iterative decoding count output unit 101*b* performs the process in step S16 shown in FIG. 3.

Figure 7:
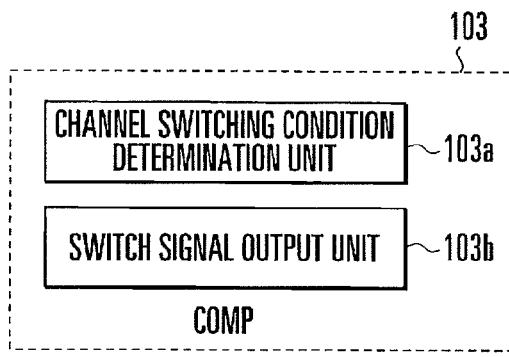
FIG. 7 is a view showing an example of the arrangement of a comparator.

Note also that the comparator 103 of the channel switching signal generating circuit 406 shown in FIG. 2 may also include a channel switching condition determination unit 103*a* and switch signal output unit 103*b* as shown in FIG. 7. The channel switching condition determination unit 103*a* performs the process in step S22 shown in FIG. 4. The switch signal output unit 103*b* performs the process in step S23 shown in FIG. 4.

Second Exemplary Embodiment

Figure 8:
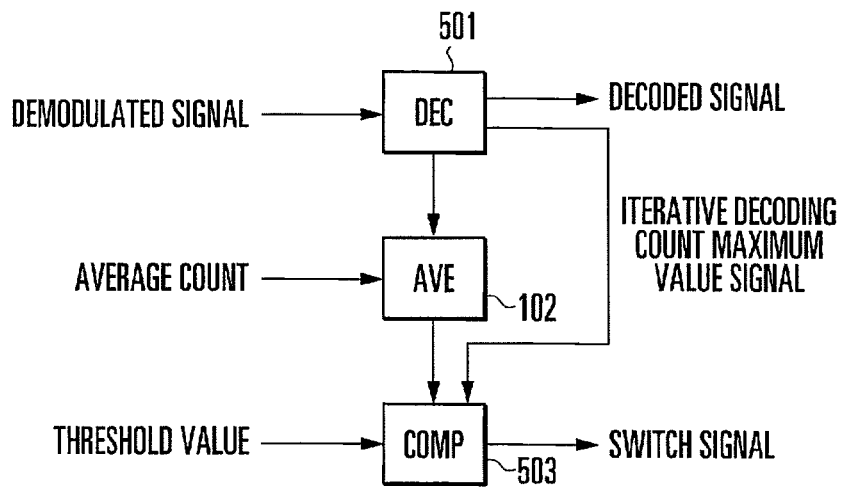
FIG. 8 is a block diagram showing another example of the arrangement of the channel switching signal generating circuit.

The second exemplary embodiment of the present invention will be explained below with reference to the accompanying drawings. FIG. 8 is a block diagram showing another example of the arrangement of the channel switching signal generating circuit. In FIG. 8, the same reference numerals as in FIG. 2 denote the same parts or similar parts. As shown in FIG. 8, this exemplary embodiment differs from the first exemplary embodiment in that an error correction decoder 501 outputs an iterative decoding count to an averaging circuit 102, and also outputs, as an output signal, a signal (iterative decoding count maximum value signal) indicating that the iterative decoding count has reached a maximum value, to a comparator 503.

In this exemplary embodiment, as in the first exemplary embodiment, the error correction decoder 501 has a function of executing a predetermined error correcting operation and outputting a decoding result. The error correction decoder 501 also has a function of counting the number of times of iterative decoding executed during the course of the predetermined error correcting operation, and outputting the iterative decoding count to the averaging circuit 102. Furthermore, in addition to the functions disclosed in the first exemplary embodiment, the error correction decoder 501 has a function of outputting an iterative decoding count maximum value signal to the comparator 503 when determining that the iterative decoding count has reached a predetermined maximum count, even if the number of bit errors is not 0 (e.g., even if a syndrome is not 0).

Also, as in the first exemplary embodiment, the comparator 503 of this exemplary embodiment has a function of outputting a switch signal for controlling channel switching to a channel switching circuit 405 if the average value of the iterative decoding counts exceeds a threshold value. Furthermore, in addition to the functions disclosed in the first exemplary embodiment, the comparator 503 has a function of determining that the channel switching condition is met, when receiving the iterative decoding count maximum value signal from the error correction decoder 501, and outputting a switch signal to the channel switching circuit 405.

Note that the comparator 503 may also calculate the occurrence probability at which the error correction decoder 501 outputs the iterative decoding count maximum value signal, and determine whether the occurrence probability of the iterative decoding count maximum value signal is higher than a predetermined threshold value. For example, the comparator 503 may calculate the occurrence probability of the iterative decoding count maximum value signal by counting the number of iterative decoding count maximum value signals input from the error correction decoder 501 within a predetermined time. The comparator 503 may also determine whether the calculated occurrence probability is higher than a predetermined threshold value. When determining that the occurrence probability of the iterative decoding count maximum value signal is higher than the predetermined threshold value, the comparator 503 may determine that the channel switching condition is met, and output a switch signal.

Note that the functions of the averaging circuit 102 are the same as those of the averaging circuit 102 disclosed in the first exemplary embodiment.

As explained in the first exemplary embodiment, the decoding count has its upper limit. Also, if the BER is high, the number of bit errors does not become 0 even when the error correction decoder 501 iteratively executes the decoding process until the upper-limiting count. Accordingly, the occurrence probability of the signal (iterative decoding count maximum value signal) indicating that the decoding count has reached the upper limit also depends on the BER before correction. If the activation threshold value of a switch signal is high, therefore, it is also possible to generate a switch signal on the basis of the iterative decoding count maximum value signal as described above, and output the switch signal to the channel switching circuit 405.

In this exemplary embodiment as described above, a switch signal can be output to the channel switching circuit 405 even when the bit error rate does not become 0 although the decoding process is iteratively executed until the predetermined upper-limiting count.

Note that in this exemplary embodiment, the channel switching signal generating circuit determines whether the channel switching condition is met, on the basis of the iterative decoding count maximum value signal in addition to the average value of the iterative decoding counts, and outputs the switch signal. However, it is also possible to determine whether the channel switching condition is met, on the basis of only the iterative decoding count maximum value signal, and output the switch signal.

Figure 9:
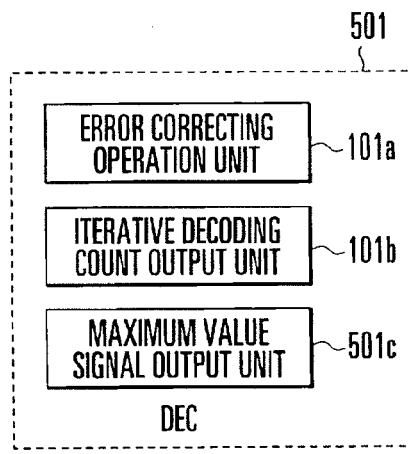
FIG. 9 is a view showing another example of the arrangement of the error correction decoder.

As shown in FIG. 9, the error correction decoder 501 may also include an error correcting operation unit 101*a*, iterative decoding count output unit 101*b*, and maximum value signal output unit 501*c*. The functions of the error correcting operation unit 101*a* and iterative decoding count output unit 101*b* are the same as those of the error correcting operation unit 101*a* and iterative decoding count output unit 101*b* disclosed in the first exemplary embodiment. The maximum value signal output unit 501*c* has a function of outputting the iterative decoding count maximum value signal described above.

Figure 10:
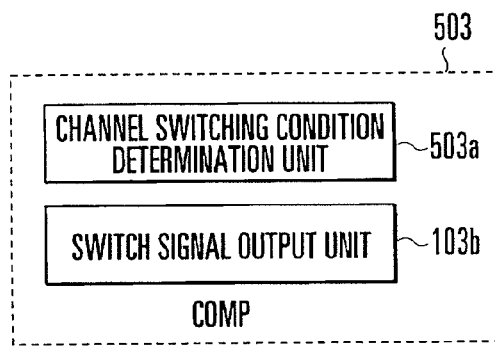
FIG. 10 is a view showing another example of the arrangement of the comparator.
Figure 11:
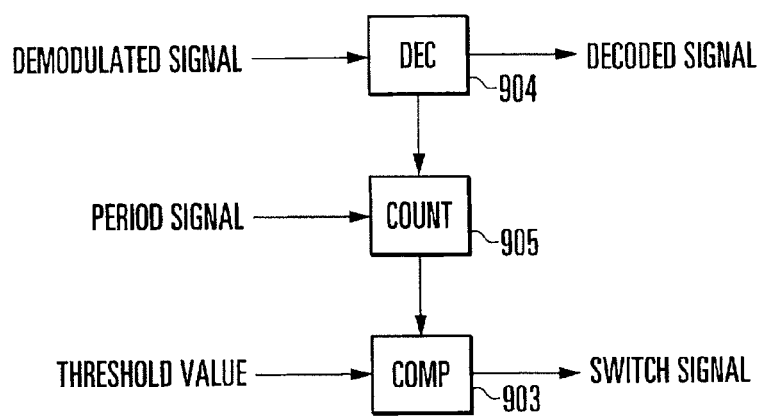
FIG. 11 is a block diagram showing an example of the arrangement of a channel switching signal generating circuit for use in a wireless communication system.
Figure 12:
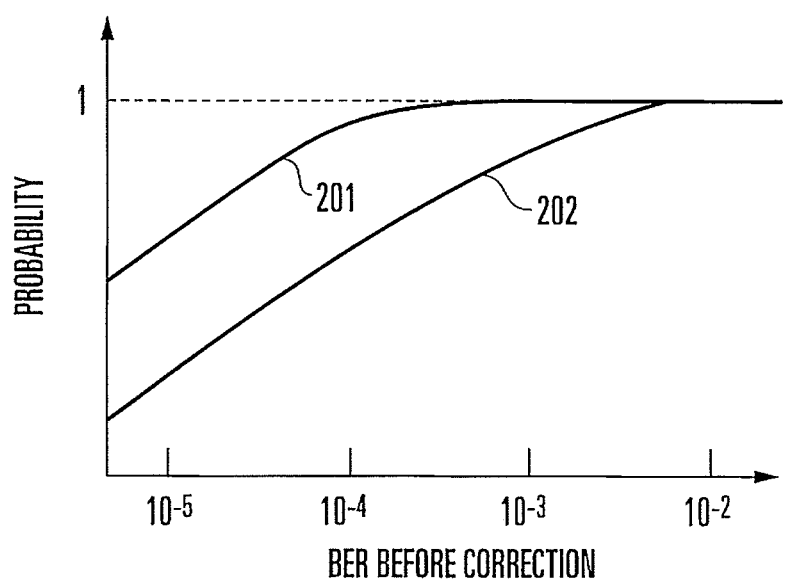
FIG. 12 is a graph showing the occurrence probability of a syndrome signal.

Furthermore, as shown in FIG. 10, the comparator 503 may also include a channel switching condition determination unit 503*a* and switch signal output unit 103*b*. The channel switching condition determination unit 503*a* has a function of determining whether the channel switching condition is met, on the basis of the average value of the iterative decoding counts or the iterative decoding count maximum value signal, as described previously. The function of the switch signal output unit 103*b* is the same as that of the switch signal output unit 103*b* disclosed in the first exemplary embodiment.

In the exemplary embodiments as described above, the error correction decoder 101 or 501 for performing iterative decoding outputs a signal of the iterative decoding count, and the BER of error correction is estimated on the basis of the iterative decoding count. Also, the average value of the iterative decoding counts is calculated, and a switch signal is output in accordance with the result of comparison of the average value of the iterative decoding counts with the preset threshold value. Since the iterative decoding count changes in accordance with the BER before correction, a BER of about $1 \times 10^{-6}$ after correction can easily be detected. Furthermore, the iterative decoding count is information required to control the operation of the error correction decoder 101 or 501, and the channel switching signal generating circuit can be implemented by only outputting the iterative decoding count to the outside. Additionally, the circuit scale of the circuit for averaging the iterative decoding counts can be very small.

In the above-mentioned exemplary embodiments, a switch signal is output by determining whether the channel switching condition is met, on the basis of the iterative decoding count of the error correcting operation. In a wireless communication system using a highly coding gain code to be iteratively decoded, therefore, a channel switching signal can be output under appropriate conditions without increasing the number of circuits.

Also, the accuracy of BER estimation can be increased by the arrangement in which the average value of the iterative decoding counts is calculated, and it is determined that the channel switching condition is met if it is determined that the average value of the iterative decoding counts is larger than a predetermined threshold value.

Furthermore, in the arrangement in which whether the channel switching condition is met is determined on the basis of the iterative decoding count maximum value signal, a switch signal can be output even when the bit error rate does not become 0 although the decoding process is iteratively executed until a predetermined upper-limiting count.

INDUSTRIAL APPLICABILITY

The present invention is applicable to a wireless communication system having a channel switching function. The present invention is particularly applicable when generating switch information in a system using a highly coding gain code to be iteratively decoded.

The invention claimed is:

1. A channel switching signal generating circuit comprising:
   an iterative decoding count output unit that outputs an iterative decoding count indicating the number of times of iterative execution of a predetermined error correcting operation;
   a channel switching condition determining means for determining unit that determines whether a channel switching condition is met, on the basis of the iterative decoding count output from said iterative decoding count output unit;
   a switch signal output unit that outputs a switch signal indicating channel switching, when said channel switching condition determining unit determines that the channel switching condition is met; and
   a maximum value signal output unit that outputs an iterative decoding count maximum value signal indicating that the iterative decoding count has reached a predetermined maximum value,
   wherein said channel switching condition determining unit determines whether an occurrence probability at which said maximum value signal output unit outputs the iterative decoding count maximum value signal is higher than a predetermined value, and
   determines that the channel switching condition is met, when determining that the occurrence probability of the iterative decoding count maximum value signal is higher than the predetermined value.

2. A channel switching signal generating circuit according to claim 1, which constitutes a wireless communication system having a channel switching function.

3. A channel switching signal generating circuit according to claim 1, further comprising an average value calculating unit that calculates an average value of iterative decoding counts equal to a predetermined number of times, when receiving the iterative decoding count output from said iterative decoding count output unit the predetermined number of times,
   wherein said channel switching condition determining unit determines whether the iterative decoding count average value calculated by said average value calculating unit is larger than a predetermined threshold value, and
   determines that the channel switching condition is met, when determining that the iterative decoding count average value is larger than the predetermined threshold value.

4. A channel switching apparatus comprising:
   an iterative decoding count output unit that outputs an iterative decoding count indicating the number of times of iterative execution of a predetermined error correcting operation;
   a channel switching condition determining unit that determines whether a channel switching condition is met, on the basis of the iterative decoding count output from said iterative decoding count output unit;
   a switch signal output unit that outputs a switch signal indicating channel switching, when said channel switching condition determining unit determines that the channel switching condition is met; and
   a maximum value signal output unit that outputs an iterative decoding count maximum value signal indicating that the iterative decoding count has reached a predetermined maximum value,
   wherein said channel switching condition determining unit determines whether an occurrence probability at which said maximum value signal output unit outputs the iterative decoding count maximum value signal is higher than a predetermined value, and
   determines that the channel switching condition is met, when determining that the occurrence probability of the iterative decoding count maximum value signal is higher than the predetermined value.

5. A channel switching apparatus according to claim 4, further comprising a channel switching unit that executes channel switching on the basis of the switch signal output from said switch signal output unit.

6. A channel switching apparatus according to claim 4, which constitutes a wireless communication system having a channel switching function.

7. A wireless communication system comprising a channel switching apparatus incorporating a channel switching signal generating circuit which outputs a switch signal indicating channel switching,
   said channel switching apparatus comprising:
   an iterative decoding count output unit that outputs an iterative decoding count indicating the number of times of iterative execution of a predetermined error correcting operation;
   a channel switching condition determining unit that determines whether a channel switching condition is met, on the basis of the iterative decoding count output from said iterative decoding count output unit;
   a switch signal output unit that outputs the switch signal indicating channel switching, when said channel switching condition determining unit determines that the channel switching condition is met; and
   a maximum value signal output unit that outputs an iterative decoding count maximum value signal indicating that the iterative decoding count has reached a predetermined maximum value,
   wherein said channel switching condition determining unit determines whether an occurrence probability at which said maximum value signal output unit outputs the iterative decoding count maximum value signal is higher than a predetermined value, and
   determines that the channel switching condition is met, when determining that the occurrence probability of the iterative decoding count maximum value signal is higher than the predetermined value.

8. A channel switching signal generating method comprising the steps of:
   outputting an iterative decoding count indicating the number of times of iterative execution of a predetermined error correcting operation;
   determining whether a channel switching condition is met, on the basis of the iterative decoding count;
   outputting a switch signal indicating channel switching, when it is determined that the channel switching condition is met; and a maximum value signal output unit that outputs an iterative decoding count maximum value signal indicating that the iterative decoding count has reached a predetermined maximum value, wherein said channel switching condition determining unit determines whether an occurrence probability at which said maximum value signal output unit outputs the iterative decoding count maximum value signal is higher than a predetermined value, and determines that the channel switching condition is met, when determining that the occurrence probability of the iterative decoding count maximum value signal is higher than the predetermined value.

9. A channel switching signal generating circuit comprising:

iterative decoding count output means for outputting an iterative decoding count indicating the number of times of iterative execution of a predetermined error correcting operation;

channel switching condition determining means for determining whether a channel switching condition is met, on the basis of the iterative decoding count output from said iterative decoding count output means;

switch signal output means for outputting a switch signal indicating channel switching, when said channel switching condition determining means determines that the channel switching condition is met; and a maximum value signal output unit that outputs an iterative decoding count maximum value signal indicating that the iterative decoding count has reached a predetermined maximum value, wherein said channel switching condition determining unit determines whether an occurrence probability at which said maximum value signal output unit outputs the iterative decoding count maximum value signal is higher than a predetermined value, and determines that the channel switching condition is met, when determining that the occurrence probability of the iterative decoding count maximum value signal is higher than the predetermined value.

10. A channel switching apparatus comprising:

iterative decoding count output means for outputting an iterative decoding count indicating the number of times of iterative execution of a predetermined error correcting operation;

channel switching condition determining means for determining whether a channel switching condition is met, on the basis of the iterative decoding count output from said iterative decoding count output means;

switch signal output means for outputting a switch signal indicating channel switching, when said channel switching condition determining means determines that the channel switching condition is met; and a maximum value signal output unit that outputs an iterative decoding count maximum value signal indicating that the iterative decoding count has reached a predetermined maximum value, wherein said channel switching condition determining unit determines whether an occurrence probability at which said maximum value signal output unit outputs the iterative decoding count maximum value signal is higher than a predetermined value, and determines that the channel switching condition is met, when determining that the occurrence probability of the iterative decoding count maximum value signal is higher than the predetermined value.

11. A wireless communication system comprising a channel switching apparatus incorporating a channel switching signal generating circuit which outputs a switch signal indicating channel switching, said channel switching apparatus comprising:

iterative decoding count output means for outputting an iterative decoding count indicating the number of times of iterative execution of a predetermined error correcting operation;

channel switching condition determining means for determining whether a channel switching condition is met, on the basis of the iterative decoding count output from said iterative decoding count output means; and switch signal output means for outputting the switch signal indicating channel switching, when said channel switching condition determining means determines that the channel switching condition is met; and a maximum value signal output unit that outputs an iterative decoding count maximum value signal indicating that the iterative decoding count has reached a predetermined maximum value, wherein said channel switching condition determining unit determines whether an occurrence probability at which said maximum value signal output unit outputs the iterative decoding count maximum value signal is higher than a predetermined value, and determines that the channel switching condition is met, when determining that the occurrence probability of the iterative decoding count maximum value signal is higher than the predetermined value.

* * * * *